(12) United States Patent
Chang (10) Patent No.: US 7,840,745 B2
(45) Date of Patent: Nov. 23, 2010

(54) DATA ACCESSING SYSTEM, CONTROLLER AND STORAGE DEVICE HAVING THE SAME, AND OPERATION METHOD THEREOF

(75) Inventor: Ching-Wen Chang, Hsinchu (TW)

(73) Assignee: Phison Electronics Corp., Hsinchu (TW)

( * ) Notice: Subject to any disclaimer, the term of this patent is extended or adjusted under 35 U.S.C. 154(b) by 643 days.

(21) Appl. No.: 11/840,678

(22) Filed: Aug. 17, 2007

(65) Prior Publication Data

US 2008/0313400 A1 Dec. 18, 2008

(30) Foreign Application Priority Data

Jun. 13, 2007 (TW) .............................. 96121287 A (51) Int. Cl.
*G06F 12/00* (2006.01)

(52) U.S. Cl. ...................................... 711/103; 711/118

(58) Field of Classification Search .................. 711/103, 711/118

See application file for complete search history.

(56) References Cited

PUBLICATIONS

"Protocol," www.dictionary.com, 2010.*

* cited by examiner

*Primary Examiner*—Shane M Thomas
(74) *Attorney, Agent, or Firm*—J.C. Patents (57) ABSTRACT

A data accessing system for interfacing between a smart card and a non-volatile memory is provided. The non-volatile memory has a smart card exclusive area accessible to a plurality of smart card applications. The smart card exclusive area includes a plurality of record unit sets respectively having a plurality of record units. The data accessing system has a buffer for temporarily storing data to be written into the smart card exclusive area and a data accessing protocol unit managing an access parameter table, a plurality of application information tables, and a plurality of record unit set link tables. The smart card applications access the smart card exclusive area in a unit of record unit set, and the size of a record unit set is a multiple of an access unit of the non-volatile memory. Accordingly, the number of accesses to the non-volatile memory is reduced and data security is increased 58 Claims, 5 Drawing Sheets

DATA ACCESSING SYSTEM, CONTROLLER AND STORAGE DEVICE HAVING THE SAME, AND OPERATION METHOD THEREOF

CROSS-REFERENCE TO RELATED APPLICATION

This application claims the priority benefit of Taiwan application serial no. 96121287, filed on Jun. 13, 2007. All disclosure of the Taiwan application is incorporated herein by reference.

BACKGROUND OF THE INVENTION

1. Field of the Invention

The present invention generally relates to a data accessing system, a controller and a storage device having the same, and an operation method thereof, in particular, to a data accessing system for interfacing between a non-volatile memory and a smart card, a controller and a storage device having the same, and an operation method thereof.

2. Description of Related Art

A memory card is a data storage device which usually uses a NAND flash memory as its storage media. A NAND flash memory is writable and erasable, and which offers power-free storage. Besides, a NAND flash memory is a non-volatile memory therefore it has the advantages of non-volatile memory such as small volume, fast access speed, and low power consumption. In addition, a NAND flash memory has high operation rate because easing data stored therein is made in a unit of block. Memory cards have been broadly applied to personal data storage due to its small volume, large capacity, and high portability. However, the data stored in a memory card may be stolen when the memory card is lost.

A smart card is an integrated circuit (IC) chip having a microprocessor, a card operating system, a security module, and a memory for executing certain operations. A smart card can provide such functions as calculation, encryption, bi-directional communication, and security such that the smart card not only stores data but also protects the data stored therein. One of the applications of smart card is the subscriber identification module (SIM) card used in a GSM (Global System for Mobile Communications) cellular phone.

To protect the data stored in a memory card, a NAND flash memory integrated with the security mechanism of a smart card is provided. However, the data used by applications in a smart card is usually composed of small data, for example, lower than 256 bytes. Thus, the life of a NAND flash memory will be shortened if the NAND flash memory is erased every time the data stored therein is slightly updated.

Accordingly, a data accessing mechanism between a NAND flash memory and a smart card is to be developed.

SUMMARY OF THE INVENTION

Accordingly, the present invention is directed to a data accessing system between a non-volatile memory and a smart card, wherein the number of accesses to the non-volatile memory is reduced so as to prolong the life of the non-volatile memory, and the security of data is increased.

The present invention is directed to a controller having a data accessing system between a non-volatile memory and a smart card, wherein the number of accesses to the non-volatile memory is reduced so as to prolong the life of the non-volatile memory, and the security of data is increased.

The present invention is directed to a storage device having a data accessing system between a non-volatile memory and a smart card, wherein the number of accesses to the non-volatile memory is reduced so as to prolong the life of the non-volatile memory, and the security of data is increased.

The present invention is directed to an operation method for accessing data between a non-volatile memory and a smart card, wherein the number of accesses to the non-volatile memory is reduced so as to prolong the life of the non-volatile memory, and the security of data is increased.

The present invention provides a data accessing system between a non-volatile memory and a smart card. The non-volatile memory has a smart card exclusive area accessible to a plurality of smart card applications in the smart card, wherein the smart card exclusive area includes a plurality of record unit sets respectively having a plurality of record units. The data accessing system includes a buffer and a data accessing protocol unit. The buffer temporarily stores the data to be written into the smart card exclusive area by the smart card applications. The data accessing protocol unit manages an access parameter table, a plurality of application information tables, and a plurality of record unit set link tables. The access parameter table records the information of the smart card exclusive area and includes a record unit size field and a record unit set size field, wherein the record unit size field records the size of each record unit, and the record unit set size field records the number of records units in each record unit set. The application information tables respectively record the information of each smart card application and the information of record units corresponding to each smart card application. The record unit set link tables respectively record the links of each record unit set so that the smart card applications can access data accordingly. When each smart card application is about to write data into the smart card exclusive area, the data accessing system temporarily stores the data into the buffer and then writes the data into the smart card exclusive area in a unit of record unit sets, wherein the size of a record unit set is a multiple of an access unit of the non-volatile memory.

According to an embodiment of the present invention, when a new smart card application is enabled, the data accessing system appoints at least one of the record unit sets to the new smart card application and records the related information of the new smart card application into an application information table corresponding to the new smart card application.

According to an embodiment of the present invention, each of the smart card applications can only access the appointed record unit sets.

According to an embodiment of the present invention, the non-volatile memory is a flash memory.

According to an embodiment of the present invention, the flash memory is a NAND flash memory.

According to an embodiment of the present invention, the flash memory is a single level cell (SLC) NAND flash memory or a multi level cell (MLC) NAND flash memory.

According to an embodiment of the present invention, the access unit of the NAND flash memory is a page or a block.

According to an embodiment of the present invention, the access parameter table further includes a version field, an encryption/decryption algorithm field, a personal password field, a card status field, an unlock password field, an application information table size field, and an application information table entry field. The version field records the version information of the data accessing system. The encryption/decryption algorithm field records an encryption/decryption algorithm for the smart card exclusive area. The personal password field records a personal password. The card status field records the status of the smart card. The unlock password field records an unlock password. The application information table size field records the sizes of the application information tables. The application information table entry field records the addresses of the application information tables.

According to an embodiment of the present invention, each of the application information tables includes an application identification code field, a first key field, a second key field, a record entry field, and an application size field. The application identification code field records an identification code of each smart card application. The first key field records a first key used for encrypting/decrypting the data transmitted between the smart card and the data accessing system. The second key field records a second key used for encrypting/decrypting the data transmitted between the smart card and the data accessing system. The record entry field records the addresses of record unit sets corresponding to each smart card application. The application size field records the number of record unit sets corresponding to each smart card application.

According to an embodiment of the present invention, each of the record unit set link tables includes a previous record unit set address field, a next record unit set address field, and an available record unit number field. The previous record unit set address field records the address of a previous record unit set linked to a current record unit set. The next record unit set address field records the address of a next record unit set linked to the current record unit set. The available record unit number field records the number of available record units in the current record unit set.

According to an embodiment of the present invention, the record unit set link tables are respectively stored in one of the record units of the record unit sets.

According to an embodiment of the present invention, the smart card cannot be operated when the smart card is in a locked status.

According to an embodiment of the present invention, the data accessing system can unlock the smart card by using the unlock password.

According to an embodiment of the present invention, the data accessing system can encrypt the smart card exclusive area with the encryption/decryption algorithm recorded in the encryption/decryption algorithm field of the access parameter table.

According to an embodiment of the present invention, the smart card exclusive area further includes an idle information record area for recording idle record unit sets.

The present invention provides a controller for a storage device. A non-volatile memory in the storage device has a smart card exclusive area accessible to a plurality of smart card applications in a smart card, wherein the smart card exclusive area includes a plurality of record unit sets respectively having a plurality of record units. The controller includes a smart card interface, a non-volatile memory interface, and a data accessing system. The smart card interface communicates with the smart card. The non-volatile memory interface accesses the non-volatile memory. The data accessing system includes a buffer and a data accessing protocol unit. The buffer temporarily stores the data to be written into the smart card exclusive area by the smart card applications. The data accessing protocol unit manages an access parameter table, a plurality of application information tables, and a plurality of record unit set link tables. The access parameter table records the information of the smart card exclusive area and includes a record unit size field and a record unit set size field, wherein the record unit size field records the size of each record unit, and the record unit set size field records the number of record units in each record unit set. The application information tables respectively record the information of each smart card application and the information of record units corresponding to each smart card application. The record unit set link tables respectively record the links of each record unit set so that the smart card applications can access data accordingly. When each smart card application is about to write data into the smart card exclusive area, the data accessing system temporarily stores the data into the buffer and then writes the data into the smart card exclusive area in a unit of record unit sets, wherein the size of a record unit set is a multiple of an access unit of the non-volatile memory.

According to an embodiment of the present invention, when a new smart card application is enabled, the data accessing system appoints at least one of the record unit sets to the new smart card application and records the related information of the new smart card application into an application information table corresponding to the new smart card application.

According to an embodiment of the present invention, each of the smart card applications can only access the appointed record unit sets.

According to an embodiment of the present invention, the non-volatile memory is a flash memory.

According to an embodiment of the present invention, the flash memory is a NAND flash memory.

According to an embodiment of the present invention, the flash memory is a SLC NAND flash memory or a MLC NAND flash memory.

According to an embodiment of the present invention, the access unit of the NAND flash memory is a page or a block.

According to an embodiment of the present invention, the access parameter table further includes a version field, an encryption/decryption algorithm field, a personal password field, a card status field, an unlock password field, an application information table size field, and an application information table entry field. The version field records the version information of the data accessing system. The encryption/decryption algorithm field records an encryption/decryption algorithm for the smart card exclusive area. The personal password field records a personal password. The card status field records the status of the smart card. The unlock password field records an unlock password. The application information table size field records the sizes of the application information tables. The application information table entry field records the addresses of the application information tables.

According to an embodiment of the present invention, each of the application information tables includes an application identification code field, a first key field, a second key field, a record entry field, and an application size field. The application identification code field records an identification code of each smart card application. The first key field records a first key used for encrypting/decrypting the data transmitted between the smart card and the data accessing system. The second key field records a second key used for encrypting/decrypting the data transmitted between the smart card and the data accessing system. The record entry field records the addresses of record unit sets corresponding to each smart card application. The application size field records the number of record unit sets corresponding to each smart card application.

According to an embodiment of the present invention, each of the record unit set link tables includes a previous record unit set address field, a next record unit set address field, and an available record unit number field. The previous record unit set address field records the address of a previous record unit set linked to a current record unit set. The next record unit set address field records the address of a next record unit set linked to the current record unit set. The available record unit number field records the number of available record units in the current record unit set.

According to an embodiment of the present invention, the record unit set link tables are respectively stored in one of the record units of the record unit sets.

According to an embodiment of the present invention, the smart card cannot be operated when the smart card is in a locked status.

According to an embodiment of the present invention, the data accessing system can unlock the smart card by using the unlock password.

According to an embodiment of the present invention, the data accessing system can encrypt the smart card exclusive area with the encryption/decryption algorithm recorded in the encryption/decryption algorithm field of the access parameter table.

According to an embodiment of the present invention, the smart card interface is an ISO 7816 interface.

According to an embodiment of the present invention, the smart card exclusive area further includes an idle information record area for recording idle record unit sets.

The present invention provides a storage device including a data transmission interface, a non-volatile memory, and a controller. The data transmission interface communicates with a host. The non-volatile memory includes a smart card exclusive area accessible to a plurality of smart card applications in a smart card, wherein the smart card exclusive area includes an application data area, an application information area, and an access parameter area, and the application data area includes a plurality of record unit sets respectively having a plurality of record units. The controller includes a smart card interface, a non-volatile memory interface, and a data accessing system. The smart card interface communicates with the smart card. The non-volatile memory interface accesses the non-volatile memory. The data accessing system includes a buffer and a data accessing protocol unit. The buffer temporarily stores the data to be written into the smart card exclusive area by the smart card applications. The data accessing protocol unit manages a data structure of the smart card exclusive area. When each smart card application is about to write data into the smart card exclusive area, the data accessing system temporarily stores the data into the buffer and then writes the data into the smart card exclusive area in a unit of record unit sets, wherein the size of a record unit set is a multiple of an access unit of the non-volatile memory.

According to an embodiment of the present invention, the data accessing protocol unit manages an access parameter table, a plurality of application information tables, and a plurality of record unit set link tables. The access parameter table records the information of the smart card exclusive area and includes a record unit size field and a record unit set size field, wherein the record unit size field records the size of each record unit, and the record unit set size field records the number of record units in each record unit set. The application information tables respectively record the information of each smart card application and the information of record units corresponding to each smart card application. The record unit set link tables respectively record the links of each record unit set so that the smart card applications can access data accordingly.

According to an embodiment of the present invention, when a new smart card application is enabled, the data accessing system appoints at least one of the record unit sets to the new smart card application and records the related information of the new smart card application into an application information table corresponding to the new smart card application.

According to an embodiment of the present invention, each of the smart card applications can only access the appointed record unit sets.

According to an embodiment of the present invention, the non-volatile memory is a flash memory.

According to an embodiment of the present invention, the flash memory is a NAND flash memory.

According to an embodiment of the present invention, the flash memory is a SLC NAND flash memory or a MLC NAND flash memory.

According to an embodiment of the present invention, the access unit of the NAND flash memory is a page or a block.

According to an embodiment of the present invention, the access parameter table further includes a version field, an encryption/decryption algorithm field, a personal password field, a card status field, an unlock password field, an application information table size field, and an application information table entry field. The version field records the version information of the data accessing system. The encryption/decryption algorithm field records an encryption/decryption algorithm for the smart card exclusive area. The personal password field records a personal password. The card status field records the status of the smart card. The unlock password field records an unlock password. The application information table size field records the sizes of the application information tables. The application information table entry field records the addresses of the application information tables.

According to an embodiment of the present invention, each of the application information tables includes an application identification code field, a first key field, a second key field, a record entry field, and an application size field. The application identification code field records an identification code of each smart card application. The first key field records a first key used for encrypting/decrypting the data transmitted between the smart card and the data accessing system. The second key field records a second key used for encrypting/decrypting the data transmitting between the smart card and the data accessing system. The record entry field records the addresses of record unit sets corresponding to each smart card application. The application size field records the number of record unit sets corresponding to each smart card application.

According to an embodiment of the present invention, each of the record unit set link tables includes a previous record unit set address field, a next record unit set address field, and an available record unit number field. The previous record unit set address field records the address of a previous record unit set linked to a current record unit set. The next record unit set address field records the address of a next record unit set linked to the current record unit set. The available record unit number field records the number of available record units in the current record unit set.

According to an embodiment of the present invention, the record unit set link tables are respectively stored in one of the record units of the record unit sets.

According to an embodiment of the present invention, the smart card cannot be operated when the smart card is in a locked status.

According to an embodiment of the present invention, the data accessing system can unlock the smart card by using an unlock password.

According to an embodiment of the present invention, the data accessing system can encrypt the smart card exclusive area with the encryption/decryption algorithm recorded in the encryption/decryption algorithm field of the access parameter table.

According to an embodiment of the present invention, the data transmission interface may be a universal serial bus (USB) interface, an IEEE 1394 interface, a SATA interface, a PCI Express interface, a memory stick (MS) interface, a multi media card (MMC) interface, a secure digital (SD) card interface, a compact flash (CF) card interface, or a integrated drive electronics (IDE) interface.

According to an embodiment of the present invention, the non-volatile memory further includes a data storage area which is accessed by a host.

According to an embodiment of the present invention, the smart card interface is an ISO 7816 interface.

According to an embodiment of the present invention, the smart card exclusive area further includes an idle information record area for recording idle record unit sets.

The present invention provides an operation method for accessing data between a non-volatile memory and a smart card. The non-volatile memory has a smart card exclusive area accessible to a plurality of smart card applications in the smart card, wherein the smart card exclusive area includes a plurality of record unit sets respectively having a plurality of record units. The operation method includes appointing at least one of the record unit sets to a new smart card application and recording the related information of the new smart card application into an application information table corresponding to the new smart card application. The operation method also includes temporarily storing the data to be written by the smart card application into a buffer and then writing the data into the record unit sets corresponding to the smart card application in a unit of record unit set. The operation method further includes accessing the record unit sets corresponding to the smart card application according to an application information table corresponding to the smart card application when the smart card application is about to read a data recorded in the smart card exclusive area, wherein the size of a record unit set is a multiple of an access unit of the non-volatile memory.

According to an embodiment of the present invention, the non-volatile memory is a flash memory.

According to an embodiment of the present invention, the flash memory is a NAND flash memory.

According to an embodiment of the present invention, the flash memory is a SLC NAND flash memory or a MLC NAND flash memory.

According to an embodiment of the present invention, the access unit of the NAND flash memory is a page or a block.

According to an embodiment of the present invention, the access parameter table includes a record unit size field, a record unit set size field, a version field, an encryption/decryption algorithm field, a personal password field, a card status field, an unlock password field, an application information table size field, and an application information table entry field. The record unit size field records the size of each record unit. The record unit set size field records the number of record units in each record unit set. The version field records the version information of the data accessing system. The encryption/decryption algorithm field records an encryption/decryption algorithm for the smart card exclusive area. The personal password field records a personal password. The card status field records the states of the smart card. The unlock password field records an unlock password. The application information table size field records the sizes of the application information tables. The application information table entry field records the addresses of the application information tables.

According to an embodiment of the present invention, each of the application information tables includes an application identification code field, a first key field, a second key field, a record entry field, and an application size field. The application identification code field records an identification code of each smart card application. The first key field records a first key used for encrypting/decrypting the data transmitted between the smart card and the data accessing system. The second key field records a second key used for encrypting/decrypting the data transmitted between the smart card and the data accessing system. The record entry field records the addresses of record unit sets corresponding to each smart card application. The application size field records the number of record unit sets corresponding to each smart card application.

According to an embodiment of the present invention, each of the record unit set link tables includes a previous record unit set address field, a next record unit set address field, and an available record unit number field. The previous record unit set address field records the address of a previous record unit set linked to a current record unit set. The next record unit set address field records the address of a next record unit set linked to the current record unit set. The available record unit number field records the number of available record units in the current record unit set.

According to an embodiment of the present invention, the operation method further includes comparing the personal password recorded in the access parameter table and a password transmitted by the smart card in order to identify a user.

According to an embodiment of the present invention, the operation method further includes unlocking the smart card with an unlock password when the smart card is in a locked status.

According to an embodiment of the present invention, the operation method further includes encrypting/decrypting a data read from the smart card exclusive area with the first key and the second key.

According to an embodiment of the present invention, the operation method further includes encrypting/decrypting a data to be written into the smart card exclusive area with the first key and the second key.

The data accessing system, controller, and storage device in the present invention provide a data accessing mechanism between a smart card and a non-volatile memory. Accordingly the number of accesses to the non-volatile memory is reduced and the security of data is increased.

The operation method in the present invention adopts a data accessing mechanism between a smart card and a non-volatile memory. Accordingly the number of accesses to the non-volatile memory is reduced and the security of data is increased.

BRIEF DESCRIPTION OF THE DRAWINGS

The accompanying drawings are included to provide a further understanding of the invention, and are incorporated in and constitute a part of this specification. The drawings illustrate embodiments of the invention and, together with the description, serve to explain the principles of the invention.

DESCRIPTION OF THE EMBODIMENTS

Reference will now be made in detail to the present preferred embodiments of the invention, examples of which are illustrated in the accompanying drawings. Wherever possible, the same reference numbers are used in the drawings and the description to refer to the same or like parts.

Figure 1:
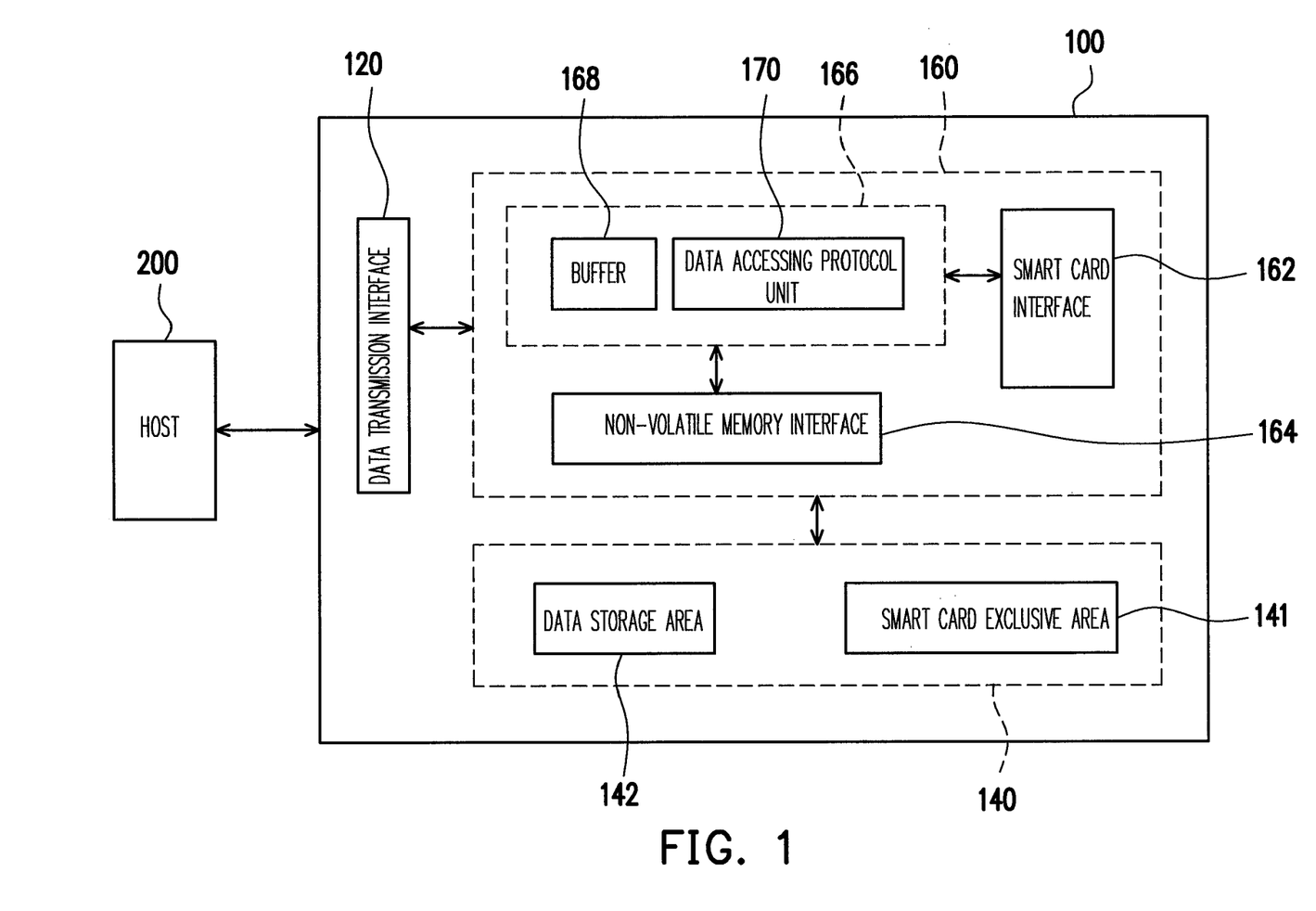
FIG. 1 is a block diagram of a storage device according to an embodiment of the present invention.

FIG. 1 is a block diagram of a storage device according to an embodiment of the present invention.

Referring to FIG. 1, the storage device 100 includes a data transmission interface 120, a non-volatile memory 140, and a controller 160.

The data transmission interface 120 is electrically connected to the controller 160 and configured for communicating with a host 200. In other words, the host 200 may access the storage device 100 via the data transmission interface 120. To be specific, the host 200 may store data into the storage device 100 through the data transmission interface 120, and may read data stored in the storage device 100 through the data transmission interface 120. The data transmission interface 120 may be a universal serial bus (USB) interface, an IEEE 1394 interface, a SATA interface, a PCI Express interface, a memory stick (MS) interface, a multi media card (MMC) interface, a secure digital (SD) card interface, a compact flash (CF) card interface, or a integrated drive electronics (IDE) interface.

The non-volatile memory 140 is electrically connected to the controller 160 and is used for storing data. The non-volatile memory 140 includes a smart card exclusive area 141 which is accessed by a smart card (not shown). To be specific, the smart card exclusive area 141 is accessed by a plurality of smart card applications (not shown) in the smart card.

In another embodiment of the present invention, the non-volatile memory 140 further includes a data storage area 142 which is accessed by the host 200. In other words, the data storage area 142 is not restricted by the security mechanism of the smart card, namely, the host 200 can perform non-secure data accesses to the data storage area 142.

Figure 2:
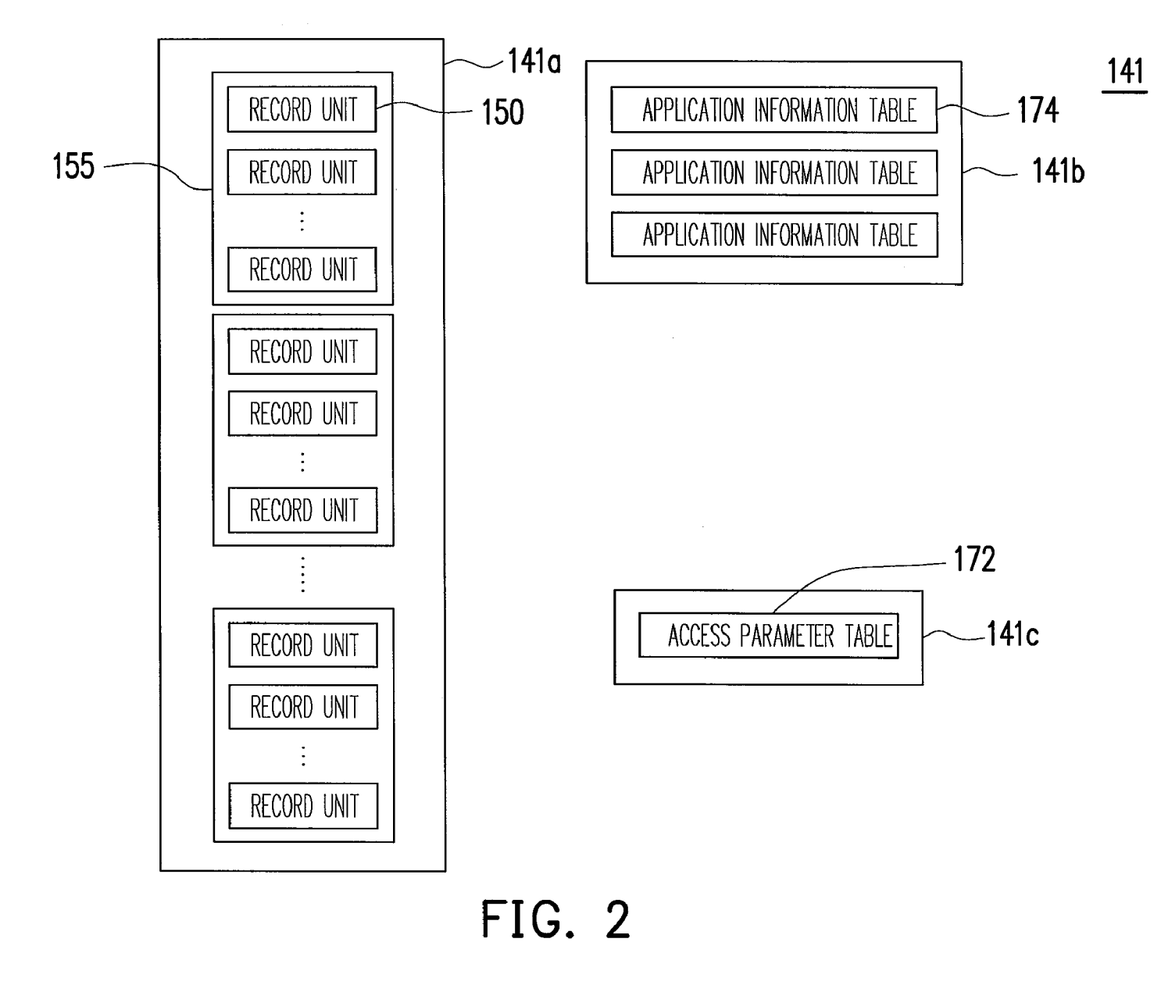
FIG. 2 is a block diagram of a smart card exclusive area in FIG. 1.

FIG. 2 is a block diagram of a smart card exclusive area in FIG. 1. Referring to FIG. 2, the smart card exclusive area 141 includes an application data area 141a, an application information area 141b, and an access parameter area 141c.

The application data area 141a stores the data to be recorded by the smart card applications, and the application data area 141a includes a plurality of record unit sets 155 respectively having a plurality of record units 150. The size of each record unit set 155 is a multiple of an access unit of the non-volatile memory 140.

In the present embodiment, the non-volatile memory 140 is a NAND flash memory, and the NAND flash memory is written in a unit of a page and is erased in a unit of a block. Thus, in the present embodiment, the access unit of the non-volatile memory 140 is a page (or a block).

In the present embodiment, the NAND flash memory may be a single level cell (SLC) NAND flash memory or a multi level cell (MLC) NAND flash memory.

Table 1 shows an example of the conversion between an access unit of a non-volatile memory and a record unit set according to the present invention. In table 1, it is assumed that the access unit of the non-volatile memory 140 is a page and a page has 512 bytes. When the size of a record unit set is set to a page, a record unit can be set to 64 bytes such that each record unit set includes 8 record units (i.e. 64*8=512 bytes), or a record unit can be set to 128 bytes such that each record unit set includes 4 record units (i.e. 128*4=512 bytes). In addition, when the size of a record unit set is set to two pages, a record unit can be set to 64 bytes such that each record unit set includes 16 record units (i.e. 64*16=1024 bytes), or a record unit can be set to 128 bytes such that each record unit set includes 8 record units (i.e. 128*8=1024 bytes). As described above, when the size of a record unit set is set to a multiple of a page, the number of record units in each record unit set can be determined according to the predetermined size of a record unit.

TABLE 1

Page × 512 = Size of a record unit × Number of record units in a record unit set

| Page | Size of a record unit (byte) | Number of record units in a record unit set |
|---|---|---|
| 1 | 64 | 8 |
| 1 | 128 | 4 |
| 2 | 64 | 16 |
| 2 | 128 | 8 |
| 4 | 64 | 32 |
| 4 | 128 | 16 |
| 8 | 64 | 64 |
| 8 | 128 | 32 |

Figure 3:
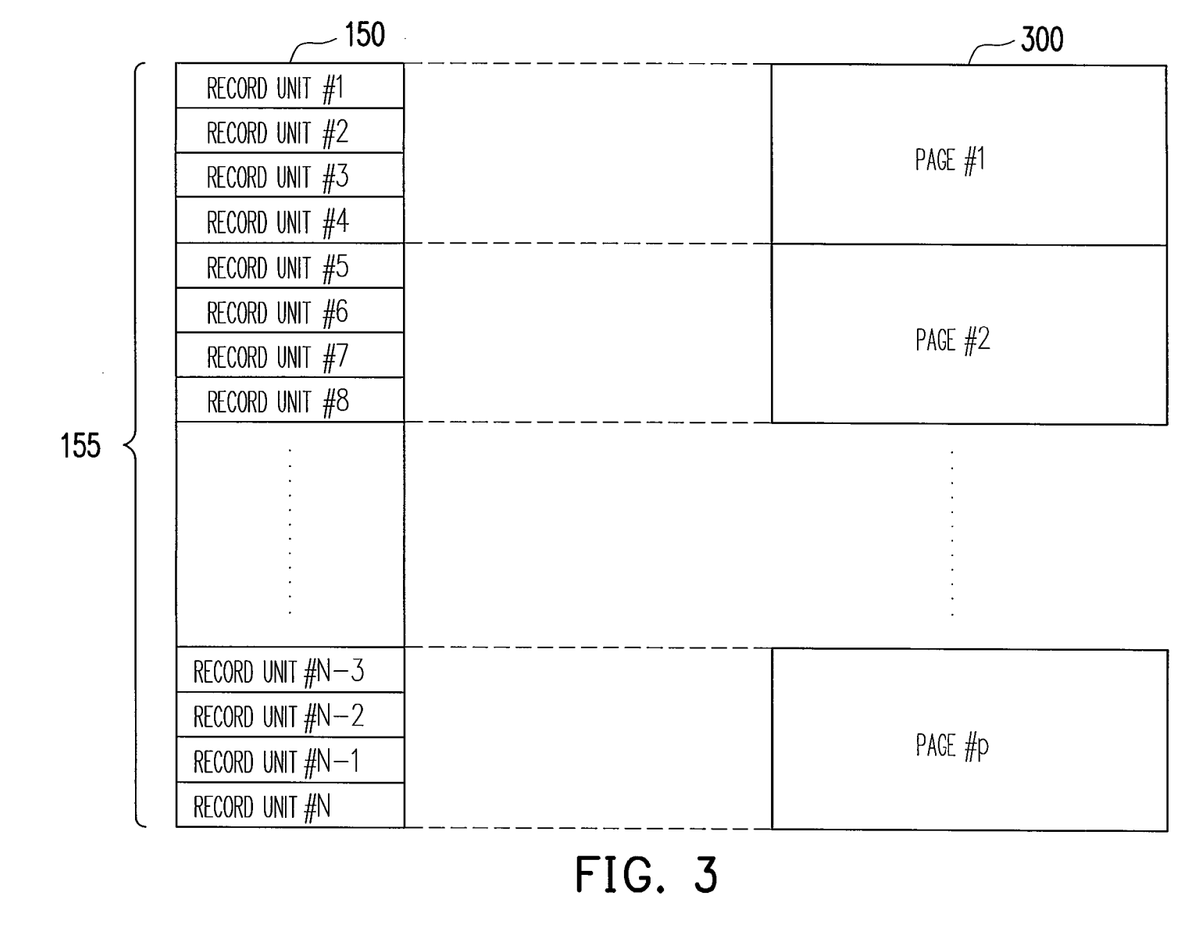
FIG. 3 is a block diagram illustrating an example of an access unit conversion.

FIG. 3 is a block diagram illustrating an example of an access unit conversion. Referring to FIG. 3, a record unit set 155 includes N record units 150, and the size of the record unit set 155 is corresponding to the size of P pages 300 of the non-volatile memory 140. Since the access unit of the smart card applications is usually small (for example, lower than 256 bytes), if the data of the smart card applications is accessed in the access unit (page) of the non-volatile memory 140, the number of operations for erasing the non-volatile memory 140 will be increased and accordingly the life of the non-volatile memory 140 will be shortened. Accordingly, through the conversion between the record unit set 155 and the record units 150, the data of the smart card applications is first recorded in the unit of the record unit 150 and then written into the non-volatile memory 140 in the unit of the record unit set 155 so as to reduce the number of accesses to the non-volatile memory 140. Moreover, it can be understood from FIG. 3 that the data of only one smart card application is stored in pages 1~p, thus, the data of other smart card applications will not be affected when the data in these pages are accessed. Accordingly the security of data is increased and data management is simplified.

Referring to FIG. 2 again, the application information area 141b records the related information of the smart card applications. To be specific, the application information area 141b includes a plurality of application information tables 174 respectively recording the information of each smart card application.

The access parameter area 141c records the related information of the smart card exclusive area. To be specific, the access parameter area 141c includes an access parameter table 172 recording the access parameters of the smart card exclusive area. Below, the information recorded in the application data area 141a, the application information area 141b, and the access parameter area 141c will be described in detail.

Referring to FIG. 1 again, the controller 160 controls the entire operation of the storage device 100. The controller 160 includes a smart card interface 162, a non-volatile memory interface 164, and a data accessing system 166.

The controller 160 may communicates with the smart card through the smart card interface 162. Namely, the smart card applications may access the data stored in the non-volatile memory 140 of the storage device 100 through the smart card interface 162 under the control of the controller 160. The smart card interface 162 may be an ISO 7816 interface.

The controller 160 may communicate with the non-volatile memory 140 through the non-volatile memory interface 164. For example, when the host 200 is about to access the data storage area 142 of the non-volatile memory 140, the host 200 may access the data storage area 142 through the data transmission interface 120 and the non-volatile memory interface 164 under the control of the controller 160. For example, when the smart card is about to access the smart card exclusive area 141 in the non-volatile memory 140, the smart card may access the smart card exclusive area 141 through the smart card interface 162, the non-volatile memory interface 164, and the data accessing system 166 under the control of the controller 160.

The data accessing system 166 may be a bridge for accessing data between the non-volatile memory 140 and the smart card. The data accessing system 166 includes a buffer 168 for temporarily storing the data to be written into the smart card exclusive area by the smart card applications and a data accessing protocol unit 170 for defining a data structure of the smart card exclusive area.

The data accessing protocol unit 170 manages an access parameter table 172, a plurality of application information tables 174, and a plurality of record unit set link tables 176.

TABLE 2

| Title of field | Bytes | Description |
| --- | --- | --- |
| Record unit size | 1 | Records the size of each record unit |
| Record unit set size | 1 | Records the number of record units in each record unit set |
| Version | 1 | Records the version information of the data accessing system |
| Encryption/decryption algorithm | 1 | Records an encryption/decryption algorithm for the smart card exclusive area |
| Personal password | 32 | Records a personal password |
| Card status | 1 | Records the status of the smart card |
| Unlock password | 255 | Records an unlock password |
| application information table size field | 1 | Records the sizes of the application information tables |
| application information table entry | 3 | Records the addresses of the application information tables |

The record unit size field records the size of each record unit 150.

The record unit set size field records the number of record units 150 in each record unit set 155.

The version field records a version information of the data accessing system 166.

The encryption/decryption algorithm field records an encryption/decryption algorithm for the smart card exclusive area 141. In the present embodiment, the smart card exclusive area encrypts the data stored therein with the encryption/decryption algorithm so as to protect this data.

The personal password field records a personal password which can be used for identifying a user.

The card status field records a status of the smart card. For example, the smart card cannot be operated if the smart card is in a locked status.

The unlock password field records an unlock password which is used for unlocking the smart card.

The application information table size field records the sizes of the application information tables 174.

The application information table entry field records the addresses of the application information tables 174 which store the related information of the smart card applications.

In the present embodiment, the application information tables 174 are stored in the application information area 141*b* and respectively record the information of the smart card applications and the information of the record units 150 corresponding to the smart card applications. Each of the application information tables 174 includes an application identification code field, a first key field, a second key field, a record entry field, and an application size field (as shown in table 3).

TABLE 3

| Title of field | Bytes | Description |
| --- | --- | --- |
| Application identification code | 16 | Records an identification code of each smart card application |
| First key | 8 | Records a first key used for encrypting/decrypting the data transmitted between the smart card and the data accessing system |
| Second key | 8 | Records a second key used for encrypting/decrypting the data transmitted between the smart card and the data accessing system |
| record entry | 3 | Records the addresses of record unit sets corresponding to each smart card application |
| Application size | 3 | Records the number of record unit sets corresponding to each smart card application |

The application identification code field records an identification code of each smart card application.

The first key field records a first key used for encrypting/decrypting the data transmitted between the smart card and the data accessing system 166.

The second key field records a second key used for encrypting/decrypting the data transmitted between the smart card and the data accessing system 166.

For example, the first key is a private key and the second key is a public key. When the data accessing system 166 encrypts a data with the first key, the smart card can only decrypt the data with the second key. While when the smart card encrypts the data with the second key, the data accessing system 166 can only decrypt the data with the first key. In other words, the first key and the second key are used for protecting the data transmitted between the smart card and the data accessing system 166.

The record entry field records the addresses of record unit sets corresponding to each smart card application.

The application size field records the number of record unit sets corresponding to each smart card application.

In the present embodiment, the record unit set link tables 176 are stored in the application data area 141*a* and record the links between the record unit sets 155 so that the smart card applications can access data accordingly. In particular, the record unit set link tables 176 are respectively stored in one of the record units 150 of the record unit sets 155. Each of the record unit set link tables 176 includes a previous record unit set address field, a next record unit set address field, and an available record unit number field (as shown in table 4).

TABLE 4

| Title of field | Bytes | Description |
| --- | --- | --- |
| previous record unit set address | 3 | Records the address of a previous record unit set |
| next record unit set address | 3 | Records the address of a next record unit set |
| available record unit number | 1 | Recording the number of available record units |

The previous record unit set address field records the address of a previous record unit set linked to a current record unit set.

The next record unit set address field records the address of a next record unit set linked to the current record unit set.

For example, when the record unit sets appointed to a smart card application are sequentially a first record unit set, a second record unit set, and a third record unit set, 0xFFFFFF is recorded in the previous record unit set address field of the record unit set link table 176 corresponding to the first record unit set, which denotes that the first record unit set is the first record unit set, and the address of the second record unit set is recorded in the next record unit set address field. Meanwhile, the address of the first record unit set is recorded in the previous record unit set address field of the record unit set link table 176 corresponding to the second record unit set, and the address of the third record unit set is recorded into the next record unit set address field. Moreover, the address of the second record unit set is recorded in the previous record unit set address field of the record unit set link table 176 corresponding to the third record unit set, and 0xFFFFFF is recorded in the next record unit set address field, which denotes that the third record unit set is the last record unit set.

The available record unit number field records the number of available record units 150 in the current record unit set.

Figure 4:
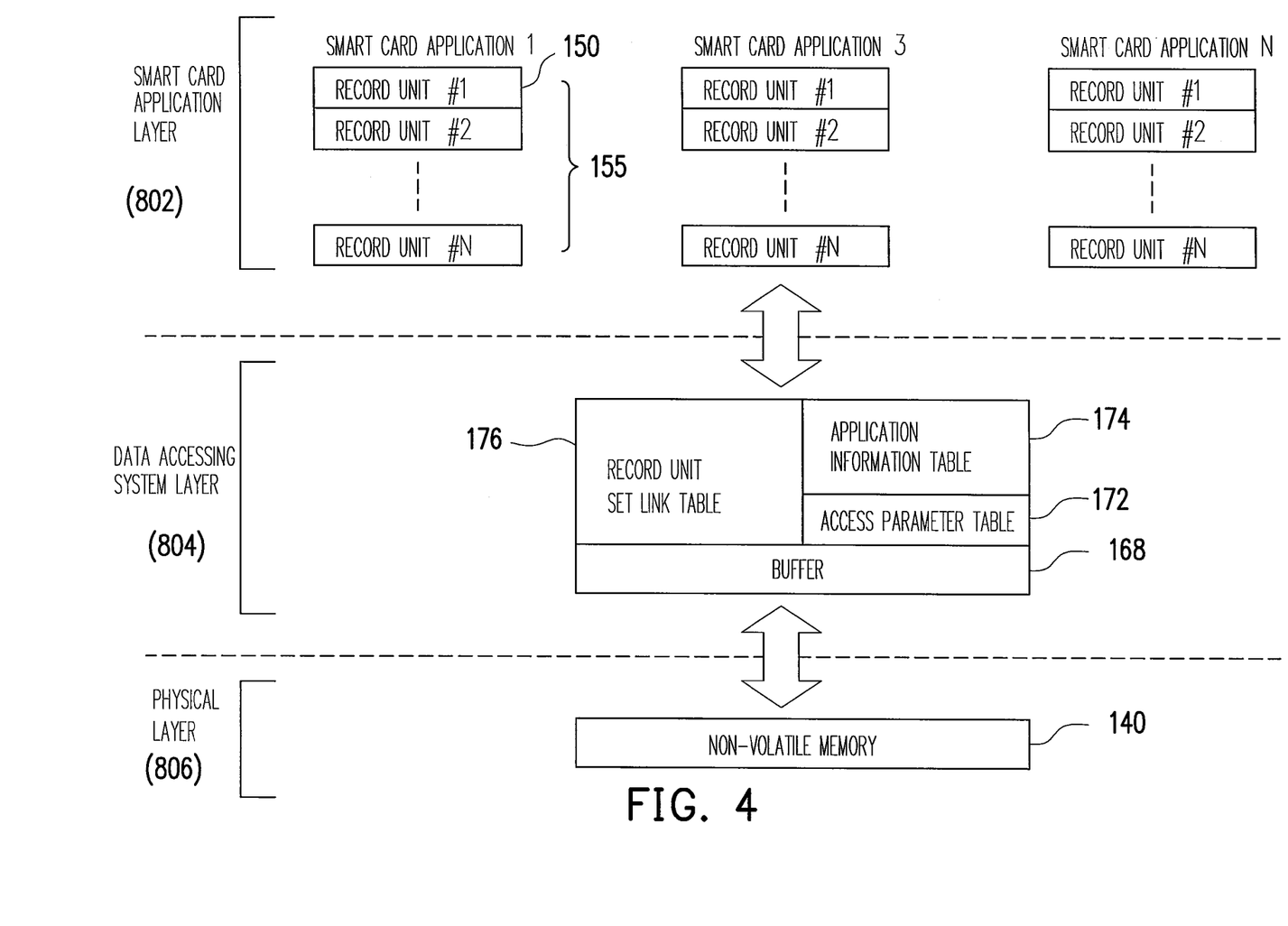
FIG. 4 is a diagram illustrating a smart card accessing a non-volatile memory through a data accessing system according to an embodiment of the present invention.

FIG. 4 is a diagram illustrating a smart card accessing a non-volatile memory through a data accessing system according to an embodiment of the present invention.

Referring to FIG. 4, the smart card accesses the non-volatile memory in three layers. The first layer 802 is the data structure layer of the smart card applications, wherein data is recorded in a unit of the record unit 150 and each smart card application can only access the corresponding data structures. The second layer 804 is a data accessing system layer. In the second layer 804, the records to be accessed by the smart card are converted into appropriate access units of the non-volatile memory 140 through the buffer 168, and the data accessing protocol unit 170 under the control of the controller 160. The method for mapping the data structure of the smart card applications to the access unit of the non-volatile memory 140 has been described in foregoing FIG. 3 and FIG. 4 therefore will not be described herein. The third layer is a physical layer 806. Namely, the converted records are written into the non-volatile memory 140 under the control of the controller 160.

Figure 5:
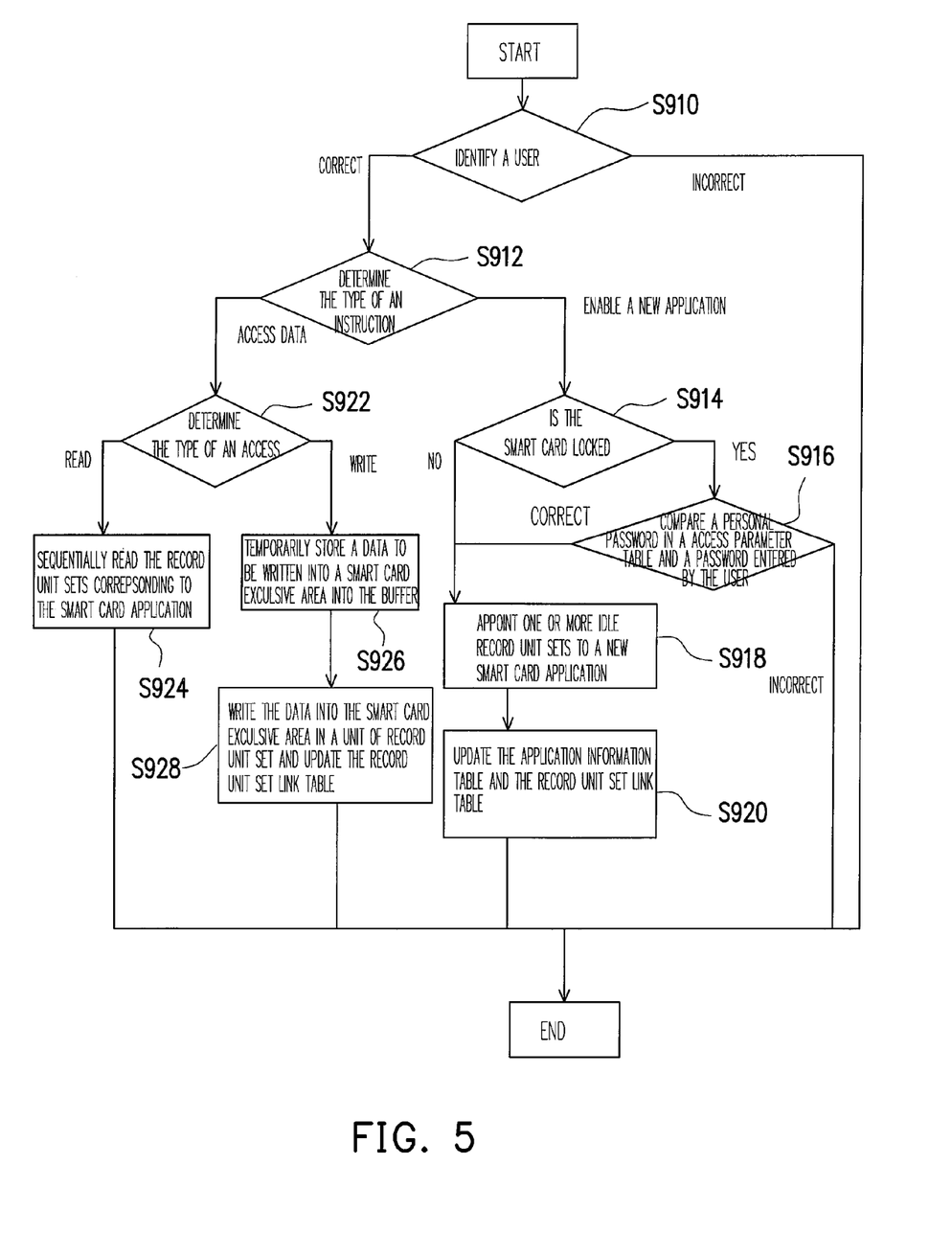
FIG. 5 is a flowchart illustrating an operation method of a data accessing system according to an embodiment of the present invention.

FIG. 5 is a flowchart illustrating an operation method of a data accessing system according to an embodiment of the present invention.

Referring to FIG. 5, a password comparison mechanism is started to compare a password entered by a user and the personal password stored in the access parameter table 172 when a smart card application is about to access data or a new smart card application is to be enabled (step S910). If the two passwords match each other, whether the instruction is to access data or enable a new smart card application is determined (step S912). Otherwise, if the two passwords do not match each other, the operation of the smart card is terminated.

If it is determined that a new smart card application is to be enabled, whether the smart card is in a locked status is determined according to the card status field of the access parameter table 172 (step S914). If the smart card is in a locked status, a card unlocking mechanism is started to require the user to input an unlock password, and this unlock password entered by the user is compared with the unlock password stored in the access parameter table 172 (step S916). If the two passwords match each other, one or more idle record unit sets are searched according to the requirement of the smart card application and appointed to the smart card application (step S918).

In another embodiment of the present invention, the smart card exclusive area further includes an idle information record area (not shown) for recording idle space so as to speed up the search of idle record unit sets.

Thereafter, the application information table 174 corresponding to the smart card application and the record unit set link tables 176 of one or more record unit sets corresponding to the smart card application are updated (step S920).

If in step S916, the two passwords do not match each other, the operation of adding a new smart card application is terminated.

If in step S914, it is determined that the smart card is not in a locked status, step S918 is executed.

If in step S912, it is determined that a data access of a smart card application is to be executed, whether the access is to read or write a data is determined (step S922). If the smart card application is about to read a data, the record unit sets corresponding to the smart card application are sequentially read according to the addresses thereof recorded in the record entry field of the application information table 174 to find the data to be read (step S924), wherein because each smart card application can only read the record unit sets according to the information in the application information table 174 thereof, the privacy and entirety of data can be ensured.

If the smart card application is about to write a data, the data is temporarily stored in the buffer 168 (step S926), and then the data is written into the non-volatile memory 140 in a unit of record unit set and the record unit set link table 176 is updated (step S928). Since only the data of the smart card application is written into the corresponding record unit sets, the entirety of data is ensured. Moreover, the data is written into the non-volatile memory 140 in a unit of record unit set, thus, the number of operations for erasing the non-volatile memory 140 is reduced and accordingly the life of the non-volatile memory 140 is prolonged.

In the present embodiment, steps S924 and S926 further include encrypting/decrypting the data read from or written into the smart card exclusive area 141 with the first key and the second key recorded in the application information table 174. To be specific, in step S924, the data to be read by the smart card application is first encrypted with the first key and then transmitted to the smart card, and when the smart card receives the data, it decrypts the data with the second key. Similarly, in step S926, the data to be written by the smart card application is first encrypted with the second key and then transmitted to the data accessing system 166, and the data accessing system 166 has to decrypts the data with the first key after it receives the data. However, it has to be understood that the first key and the second can be switched without departing the spirit and scope of the present invention.

In overview, the present invention provides a data accessing system between a smart card and a non-volatile memory. With the data accessing system, data accesses of the smart card are performed in a unit of record unit set, and accordingly, waste of storage space is avoided and the number of accesses to the non-volatile memory is reduced. Moreover, each smart card application accesses data in a unit of record unit set, thus, the data of different smart card applications can be completely separated and accordingly the privacy and entirety of the data are ensured. Furthermore, the information of all the index files are distributed in the smart card exclusive area and all the information is protected by a security mechanism, thus, the security of data is increased.

It will be apparent to those skilled in the art that various modifications and variations can be made to the structure of the present invention without departing from the scope or spirit of the invention. In view of the foregoing, it is intended that the present invention cover modifications and variations of this invention provided they fall within the scope of the following claims and their equivalents.

What is claimed is:

1. A data accessing system, for interfacing between a non-volatile memory and a smart card, the non-volatile memory having a smart card exclusive area accessible to a plurality of smart card applications of the smart card, wherein the smart card exclusive area comprises a plurality of record unit sets respectively having a plurality of record units, the data accessing system comprising:
   a buffer, for temporarily storing the data to be written into the smart card exclusive area by the smart card applications; and
   a data accessing protocol unit, configured to manage an access parameter table, a plurality of application information tables and a plurality of record unit set link tables,
   wherein the access parameter table is configured for recording information of the smart card exclusive area, and comprises a record unit size field recording a size of each of the record units and a record unit set size field recording a quantity of record units in each of the record unit sets;
   wherein the application information tables are configured for respectively recording information of each of the smart card applications and information of record units corresponding to each of the smart card applications; and
   wherein the record unit set link tables are configured for respectively recording link of each of the record unit sets so that the smart card applications can access data accordingly,
   wherein when one of the smart card applications is about to write a data into the smart card exclusive area, the data accessing system temporarily stores the data into the buffer and then writes the data into the smart card exclusive area in a unit of the record unit sets, and
   wherein a size of each of the record unit sets is a multiple of an access unit of the non-volatile memory.

2. The data accessing system according to claim 1, wherein when a new smart card application among the smart card applications is enabled, the data accessing system appoints at least one of the record unit sets to the new smart card application and records related information of the new smart card application into one of the application information tables corresponding to the new smart card application.

3. The data accessing system according to claim 2, wherein the new smart card application can only access the at least one of the record unit sets.

4. The data accessing system according to claim 1, wherein the non-volatile memory is a flash memory.

5. The data accessing system according to claim 4, wherein the flash memory is a single level cell (SLC) NAND flash memory or a multi level cell (MLC) NAND flash memory.

6. The data accessing system according to claim 5, wherein the access unit of the NAND flash memory is a page or a block.

7. The data accessing system according to claim 1, wherein the access parameter table further comprises:
   a version field, for recording a version information of the data accessing system;
   an encryption/decryption algorithm field, for recording an encryption/decryption algorithm for the smart card exclusive area;
   a personal password field, for recording a personal password;
   a card status field, for recording a status of the smart card;
   an unlock password field, for recording an unlock password;
   an application information table size field, for recording sizes of the application information tables; and
   an application information table entry field, for recording addresses of the application information tables.

8. The data accessing system according to claim 1, wherein each of the application information tables comprises:
   an application identification code field, for recording an identification code of each of the smart card applications;
   a first key field, for recording a first key used for encrypting/decrypting the data transmitted between the smart card and the data accessing system;
   a second key field, for recording a second key used for encrypting/decrypting the data transmitted between the smart card and the data accessing system;
   a record entry field, recording addresses of record unit sets corresponding to each of the smart card applications; and
   an application size field, recording a quantity of record unit sets corresponding to each of the smart card applications.

9. The data accessing system according to claim 1, wherein each of the record unit set link tables comprises:
   a previous record unit set address field, for recording an address of a previous record unit set linked to a current record unit set;
   a next record unit set address field, for recording an address of a next record unit set linked to the current record unit set; and
   an available record unit number field, recording a quantity of available record units in the current record unit set.

10. The data accessing system according to claim 1, wherein the record unit set link tables are respectively stored in one of the record units of the record unit sets.

11. The data accessing system according to claim 7, wherein the smart card cannot be operated when the smart card is in a locked status.

12. The data accessing system according to claim 11, wherein the data accessing system can unlock the smart card by using the unlock password.

13. The data accessing system according to claim 7, wherein the data accessing system can encrypt the smart card exclusive area by using the encryption/decryption algorithm recorded in the encryption/decryption algorithm field of the access parameter table.

14. The data accessing system according to claim 1, wherein the smart card exclusive area further comprises an idle information record area for recording idle record unit sets.

15. A controller for a storage device, a non-volatile memory in the storage device having a smart card exclusive area accessible to a plurality of smart card applications of a smart card, wherein the smart card exclusive area comprises a plurality of record unit sets respectively having a plurality of record units, the controller comprising:
 a smart card interface, for communicating with the smart card;
 a non-volatile memory interface, for accessing the non-volatile memory; and
 a data accessing system, for accessing data between the non-volatile memory and the smart card, the data accessing system comprising:
 a buffer, for temporarily storing the data to be written into the smart card exclusive area by the smart card applications; and
 a data accessing protocol unit, used to manage an access parameter table, a plurality of application information tables and a plurality of record unit set link tables
 wherein the access parameter table is configured for recording information of the smart card exclusive area, and comprises a record unit size field recording a size of each of the record units and a record unit set size field recording a quantity of record units in each of the record unit sets;
 wherein the application information tables are configured for respectively recording information of each of the smart card applications and information of record units corresponding to each of the smart card applications; and
 wherein the record unit set link tables are configured for respectively recording link of each of the record unit sets so that the smart card applications can access data accordingly,
 wherein when one of the smart card applications is about to write a data into the smart card exclusive area, the data accessing system temporarily stores the data into the buffer and then writes the data into the smart card exclusive area in a unit of the record unit sets, and
 wherein a size of each of the record unit sets is a multiple of an access unit of the non-volatile memory.

16. The controller according to claim 15, wherein when a new smart card application among the smart card applications is enabled, the data accessing system appoints at least one of the record unit sets to the new smart card application and records related information of the new smart card application into one of the application information tables corresponding to the new smart card application.

17. The controller according to claim 16, wherein the new smart card application can only access the at least one of the record unit sets.

18. The controller according to claim 15, wherein the non-volatile memory is a flash memory.

19. The controller according to claim 18, wherein the flash memory is a SLC NAND flash memory or a MLC NAND flash memory.

20. The controller according to claim 19, wherein the access unit of the NAND flash memory is a page or a block.

21. The controller according to claim 15, wherein the access parameter table further comprises:
 a version field, for recording a version information of the data accessing system;
 an encryption/decryption algorithm field, for recording an encryption/decryption algorithm for the smart card exclusive area;
 a personal password field, for recording a personal password;
 a card status field, for recording a status of the smart card;
 an unlock password field, for recording an unlock password;
 an application information table size field, for recording sizes of the application information tables; and
 an application information table entry field, for recording addresses of the application information tables.

22. The controller according to claim 15, wherein each of the application information tables comprises:
 an application identification code field, for recording an identification code of each of the smart card applications;
 a first key field, for recording a first key used for encrypting/decrypting the data transmitted between the smart card and the data accessing system;
 a second key field, for recording a second key used for encrypting/decrypting the data transmitted between the smart card and the data accessing system;
 a record entry field, for recording addresses of record unit sets corresponding to each of the smart card applications; and
 an application size field, for recording a quantity of record unit sets corresponding to each of the smart card applications.

23. The controller according to claim 15, wherein each of the record unit set link tables comprises:
 a previous record unit set address field, for recording an address of a previous record unit set linked to a current record unit set;
 a next record unit set address field, for recording an address of a next record unit set linked to the current record unit set; and
 an available record unit number field, for recording a quantity of available record units in the current record unit set.

24. The controller according to claim 15, wherein the record unit set link tables are respectively stored in one of the record units of the record unit sets.

25. The controller according to claim 21, wherein the smart card cannot be operated when the smart card is in a locked status.

26. The controller according to claim 25, wherein the data accessing system can unlock the smart card by using the unlock password.

27. The controller according to claim 21, wherein the data accessing system can encrypt the smart card exclusive area by using the encryption/decryption algorithm recorded in the encryption/decryption algorithm field of the access parameter table.

28. The controller according to claim 15, wherein the smart card interface is an ISO 7816 interface.

29. The controller according to claim 15, wherein the smart card exclusive area further comprises an idle information record area for recording idle record unit sets.

30. A storage device, comprising:
 a data transmission interface, for communicating with a host;
 a non-volatile memory, comprising a smart card exclusive area accessible to a plurality of smart card applications of a smart card, wherein the smart card exclusive area comprises an application data area, an application information area, and an access parameter area, and the application data area comprises a plurality of record unit sets respectively having a plurality of record units; and a controller, for controlling the operation of the storage device, the controller comprising:

a smart card interface, for communicating with the smart card;

a non-volatile memory interface, for accessing the non-volatile memory; and a data accessing system, comprising:

a buffer, for temporarily storing the data to be written into the smart card exclusive area by the smart card applications; and a data accessing protocol unit, used to manage an access parameter table, a plurality of application information tables and a plurality of record unit set link tables, wherein when one of the smart card applications is about to write a data into the smart card exclusive area, the data accessing system temporarily stores the data into the buffer and then writes the data into the smart card exclusive area in a unit of the record unit sets, and wherein a size of each of the record unit sets is a multiple of an access unit of the non-volatile memory.

31. The storage device according to claim 30, wherein the access parameter table is configured for recording information of the smart card exclusive area, and comprises a record unit size field and a record unit set size field, wherein the record unit size field records a size of each of the record units, and the record unit set size field records a quantity of record units in each of the record unit sets;

wherein the application information tables are configured for respectively storing information of each of the smart card applications and information of record units corresponding to each of the smart card applications; and wherein the record unit set link tables are configured for respectively storing link of each of the record unit sets so that the smart card applications can access data accordingly.

32. The storage device according to claim 31, wherein when a new smart card application among the smart card applications is added, the data accessing system appoints at least one of the record unit sets to the new smart card application and records related information of the new smart card application into one of the application information tables corresponding to the new smart card application.

33. The storage device according to claim 32, wherein the new smart card application can only access the at least one of the record unit sets.

34. The storage device according to claim 30, wherein the non-volatile memory is a flash memory.

35. The storage device according to claim 34, wherein the flash memory is a SLC NAND flash memory or a MLC NAND flash memory.

36. The storage device according to claim 35, wherein the access unit of the NAND flash memory is a page or a block.

37. The storage device according to claim 31, wherein the access parameter table further comprises:

a version field, for recording a version information of the data accessing system;

an encryption/decryption algorithm field, for recording an encryption/decryption algorithm for the smart card exclusive area;

a personal password field, for recording a personal password;

a card status field, for recording a status of the smart card;

an unlock password field, for recording an unlock password;

an application information table size field, for recording sizes of the application information tables; and an application information table entry field, for recording addresses of the application information tables.

38. The storage device according to claim 31, wherein each of the application information tables comprises:

an application identification code field, for recording an identification code of each of the smart card applications;

a first key field, for recording a first key used for encrypting/decrypting the data transmitted between the smart card and the data accessing system;

a second key field, for recording a second key used for encrypting/decrypting the data transmitted between the smart card and the data accessing system;

a record entry field, for recording addresses of record unit sets corresponding to each of the smart card applications; and an application size field, recording a quantity of record unit sets corresponding to each of the smart card applications.

39. The storage device according to claim 31, wherein each of the record unit set link tables comprises:

a previous record unit set address field, for recording an address of a previous record unit set linked to a current record unit set;

a next record unit set address field, for recording an address of a next record unit set linked to the current record unit set; and an available record unit number field, for recording a quantity of available record units in the current record unit set.

40. The storage device according to claim 31, wherein the record unit set link tables are respectively stored in one of the record units of the record unit sets.

41. The storage device according to claim 37, wherein the smart card cannot be operated when the smart card is in a locked status.

42. The storage device according to claim 41, wherein the data accessing system can unlock the smart card by using the unlock password.

43. The storage device according to claim 37, wherein the data accessing system can encrypt the smart card exclusive area by using the encryption/decryption algorithm recorded in the encryption/decryption algorithm field of the access parameter table.

44. The storage device according to claim 30, wherein the data transmission interface comprises a universal serial bus (USB) interface, an IEEE 1394 interface, a SATA interface, a PCI Express interface, a memory stick (MS) interface, a multi media card (MMC) interface, a secure digital (SD) card interface, a compact flash (CF) card interface, or an integrated drive electronics (IDE) interface.

45. The storage device according to claim 30, wherein the non-volatile memory further comprises a data storage area to be accessed by the host.

46. The storage device according to claim 30, wherein the smart card interface is an ISO 7816 interface.

47. The storage device according to claim 30, wherein the smart card exclusive area further comprises an idle information record area for recording idle record unit sets.

48. An operation method for accessing data between a non-volatile memory and a smart card, the non-volatile memory having a smart card exclusive area accessible to a plurality of smart card applications of the smart card, wherein the smart card exclusive area comprises a plurality of record unit sets respectively having a plurality of record units, the operation method comprising:

appointing at least one of the record unit sets to a new smart card application among the smart card applications and recording related information of the new smart card application into an application information table corresponding to the new smart card application;

temporarily storing a data to be written into the smart card exclusive area by the new smart card application into a buffer and then writing the data into the at least one of the record unit sets corresponding to the new smart card application in a unit of each of the record unit sets; and accessing the at least one of the record unit sets corresponding to the new smart card application according to the application information table corresponding to the new smart card application when the new smart card application is about to read the data recorded in the smart card exclusive area, wherein a size of each of the record unit sets is a multiple of an access unit of the non-volatile memory.

49. The operation method according to claim 48, wherein the non-volatile memory is a flash memory.

50. The operation method according to claim 49, wherein the flash memory is a SLC NAND flash memory or a MLC NAND flash memory.

51. The operation method according to claim 50, wherein the access unit of the NAND flash memory is a page or a block.

52. The operation method according to claim 48, further comprising using an access parameter table to record information of the smart card exclusive area, and the access parameter table comprises:

a record unit size field, for recording a size of each of the record units;

a record unit set size field, for recording a quantity of record units in each of the record unit sets;

a version field, for recording a version information;

an encryption/decryption algorithm field, for recording an encryption/decryption algorithm for the smart card exclusive area;

a personal password field, for recording a personal password;

a card status field, for recording a status of the smart card;

an unlock password field, for recording an unlock password;

an application information table size field, for recording sizes of the application information table; and an application information table entry field, for recording addresses of the application information table.

53. The operation method according to claim 48, wherein the application information table comprises:

an application identification code field, for recording an identification code of each of the smart card applications;

a first key field, for recording a first key used for encrypting/decrypting the data;

a second key field, for recording a second key used for encrypting/decrypting the data;

a record entry field, for recording addresses of record unit sets corresponding to each of the smart card applications; and an application size field, for recording a quantity of record unit sets corresponding to each of the smart card applications.

54. The operation method according to claim 48, further comprising using a plurality of record unit set link tables to respectively record a link of each of the record unit sets, and the record unit set link tables comprises:

a previous record unit set address field, for recording the address of a previous record unit set linked to a current record unit set;

a next record unit set address field, for recording the address of a next record unit set linked to the current record unit set; and an available record unit number field, for recording a quantity of available record units in the current record unit set.

55. The operation method according to claim 52, further comprising comparing the personal password recorded in the access parameter table and a password transmitted by the smart card in order to identify a user.

56. The operation method according to claim 52, further comprising unlocking the smart card by using the unlock password when the smart card is in a locked status.

57. The operation method according to claim 53, further comprising encrypting/decrypting the data read from the smart card exclusive area by using the first key and the second key.

58. The operation method according to claim 53, further comprising encrypting/decrypting the data to be written into the smart card exclusive area by using the first key and the second key.

* * * * *